(12) United States Patent
Halberstadt

(10) Patent No.: US 9,257,985 B2
(45) Date of Patent: Feb. 9, 2016

(54) SYNCHRONIZED LOGIC CIRCUIT

(71) Applicant: NXP B.V., Eindhoven (NL)

(72) Inventor: Hans Halberstadt, Groesbeek (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/676,722

(22) Filed: Apr. 1, 2015

(65) Prior Publication Data

US 2015/0318857 A1    Nov. 5, 2015

(30) Foreign Application Priority Data

Apr. 30, 2014    (EP) ..................................... 14166533

(51) Int. Cl.
  *H03K 19/00*    (2006.01)
  *H03K 19/096*    (2006.01)
(52) U.S. Cl.
  CPC .................... *H03K 19/096* (2013.01)
(58) Field of Classification Search
  CPC ... H03K 19/096; H03K 5/135; H03K 19/016; G06F 1/12
  USPC ............................................ 327/141; 326/93
  See application file for complete search history.

(56) References Cited

U.S. PATENT DOCUMENTS 5,990,715 A * 11/1999 Nishimura ............ H03L 7/0814
                                              327/158
6,115,823 A     9/2000 Velasco et al.
6,163,550 A * 12/2000 Alston ...................... H04L 7/02
                                              370/503
6,756,822 B1 *  6/2004 Kaviani ............... H03D 13/003
                                              327/12
7,627,003 B1 * 12/2009 Fouts ........................ G06F 1/04
                                              327/141
8,675,798 B1 *  3/2014 Argyres ................. H03K 5/135
                                              375/253
2003/0200470 A1 10/2003 Yamada
2005/0184769 A1 * 8/2005 Skroch ...................... G06F 1/12
                                              327/141
2008/0307240 A1 12/2008 Dahan et al.
2014/0115360 A1  4/2014 Zhou et al.

FOREIGN PATENT DOCUMENTS

WO        2004/050369 A1    6/2004

OTHER PUBLICATIONS

Extended European Search Report for EP Patent Appln. No. 14176191.6 (Nov. 28, 2014).

* cited by examiner

*Primary Examiner* — Jason M Crawford

(57) ABSTRACT

Consistent with an example embodiment, the disclosed includes a synchronized logic circuit comprising: an input module; an output module; a decision logic module connected between the input and output modules and configured to provide a next output state to the output module dependent on a current input state provided from the input and output modules; a clock module connected to the input and output modules and configured to provide a clock signal for synchronizing operation of the input and output modules; and an input detection module connected to the input module and configured to provide an enable signal to the clock module on detection of a change in an input provided to the input module, wherein the clock module is configured to provide a clock signal to the input and output modules on receiving the enable signal from the input detection circuit.

13 Claims, 9 Drawing Sheets

SYNCHRONIZED LOGIC CIRCUIT

CROSS-REFERENCE TO RELATED APPLICATIONS

This application claims the priority under 35 U.S.C. §119 of European patent application no. 14166533.1, filed on Apr. 30, 2014, the contents of which are incorporated by reference herein.

The invention relates to synchronised logic circuits, and in particular to such circuits with reduced power requirements.

There is a current and ongoing trend for integrated circuits (ICs) used for driving switched mode power supply (SMPS) circuits from analog to digital functionality. One reason for this is that digital circuits allow for much more flexibility and typically have a shorter design cycle. Synchronous digital designs, i.e. designs where all parts of a circuit are synchronised by a clock signal, are generally required, since in practice all modern tools are based on this approach.

Power saving features, such as a reduction of input power taken from a mains or other supply at no load or at low load are also becoming particularly important. Power requirements of below 30 mW or substantially less are becoming more common.

A disadvantage of synchronous digital design is the requirement to have a clock that is continuously running, and therefore consuming power. During every clock cycle current pulses are drawn from the power supply and power consumption is roughly proportional to the clock frequency. Especially when fast decisions have to be taken as result of an external event in a SMPS, such as finishing the conduction interval of a primary switch based on primary peak current of a flyback converter, the logic should be able to respond very quickly and preferably with a well predicted delay in order to prevent noise and other issues as a result of the clock not being synchronized with the event.

Using standard synchronous logic, the practical effect is that a high clock frequency is needed, resulting in significant power consumption of the digital circuitry. However, even at a high clock frequency, the clock remains uncorrelated with any particular external event. The result is an effectively random delay between an external event and the subsequent handling of the event, the delay being dependent on the arbitrary state of the clock at any given moment.

One known solution for reducing power consumption is clock gating, in which a clock is split up in such a way that the clock signal can be switched off for part of the circuit. In this way power consumption can be reduced, but as the clock is still not correlated with the external event, the random delay remains.

It is an object of the invention to address one or more of the above mentioned problems.

In accordance with a first aspect of the invention there is provided a synchronised logic circuit comprising:
  an input module;
  an output module;
  a decision logic module connected between the input and output modules and configured to provide a next output state to the output module dependent on a current input state provided from the input and output modules;
  a clock module connected to the input and output modules and configured to provide a clock signal for synchronising operation of the input and output modules; and
  an input detection module connected to the input module and configured to provide an enable signal to the clock module on detection of a change in an input provided to the input module, wherein the clock module is configured to provide a clock signal to the input and output modules on receiving the enable signal from the input detection circuit.

By allowing the clock module to be triggered by a change in the input of the circuit, the clock signal only needs to be provided to synchronise the input and output modules when such a signal is required, thereby saving on power requirements compared with having the clock module operating continuously. Additionally, the timing of each clock pulse can be more consistent, since the clock signal is provided in direct response to a change in the input, i.e. without an indeterminate delay caused by a set clock frequency. The decision logic module can thereby be made to react to a particular event with a predictable and fixed delay.

To detect the change in input, the input detection module may be configured to compare an output state of the input module with an input state of the input module and provide the enable signal to the clock module when the input and output states of the input module are unequal.

The synchronised logic circuit may comprise an output detection module connected to the output module and configured to provide an enable signal to the clock module on detection of a change in an output provided by the output module, wherein the clock module is configured to provide a clock signal to the input and output modules on receiving the enable signal from the output detection circuit. Having an output detection module in addition to the input detection module allows a further clock signal to be provided to synchronise operation of the input and output modules when the output state changes following a change in output state of the decision logic module. If an initial clock signal provided to the input and output modules on detection of a change in input results in no change in the output state of the decision logic module, no further clock signal will be required. In alternative embodiments, the clock module may be configured to operate for a set number of cycles following an initial enable signal from the input detection module.

The output detection module may be configured to compare an output state of the output module with an input state of the output module and provide the enable signal to the clock module when the input and output states of the output module are unequal.

The clock module may be configured to provide a clock signal only upon receiving an enable signal from either or both of the input and output detection modules. This minimises the number of clock signals required, thereby reducing the power requirements of the clock module to a minimum.

The synchronised logic circuit may be configured to operate as a Moore or Mealy type of state machine. Where the circuit is configured to operate as a Mealy type state machine, the synchronised logic circuit comprises a further logic module connected to the output module and configured to provide an output state dependent on the output state of the output module and the input state of the input module.

The input and output modules typically comprise a flip-flop that is configured to transfer an input state to an output state upon receiving a clock signal. Each module may comprise multiple such flip-flops depending on the number of bits required for the input and output states.

According to certain embodiments of the invention, there is provided a logic circuit structure comprising first and second synchronised logic circuits according to the first aspect, wherein the output module of the first synchronised logic circuit is connected to the input module of the second synchronised logic circuit. By dividing a larger decision logic module into two or more smaller decision logic modules, with each having a separate clock module, further savings in power requirements may be possible, since a clock pulse may not be needed for each decision logic module each time one of the input detection modules detects a change.

According to a second aspect of the invention there is provided a switched mode power supply comprising a synchronised logic circuit or logic circuit structure according to the first aspect of the invention, wherein the synchronised logic circuit or structure is configured to operate a switching state of the power supply. The switched mode power supply can be operated more efficiently at reduced power due to the clock signal being provided in response to a change in input state and with a predictable and fixed delay.

According to a third aspect of the invention there is provided a digital communications device comprising a synchronised logic circuit or logic circuit structure according to the first aspect wherein the synchronised logic circuit or logic structure is configured to operate a digital communications protocol.

According to a fourth aspect of the invention there is provided a method of operating a synchronised logic circuit according to the first aspect, comprising the sequential steps of:

the input detection module detecting a change in the input provided to the input module;

the input detection module providing an enable signal to the clock module;

the clock module providing a clock pulse signal to the input and output modules;

the input and output modules each transferring an input state to an output state in response to the clock pulse; and the decision logic responding to the output state of the input and output modules by providing a next output state to the output module.

The method may comprise the further sequential steps of:

the output detection module detecting a change in the output provided by the output module;

the output detection module providing an enable signal to the clock module;

the clock module providing a clock pulse to the input and output modules;

the input and output modules each transferring an input state to an output state in response to the clock pulse; and the decision logic responding to the output state of the input and output modules by providing a next output state to the output module.

The invention is described in further detail in the following by way of exemplary embodiments and with reference to the accompanying drawings, in which.

Figure 1:
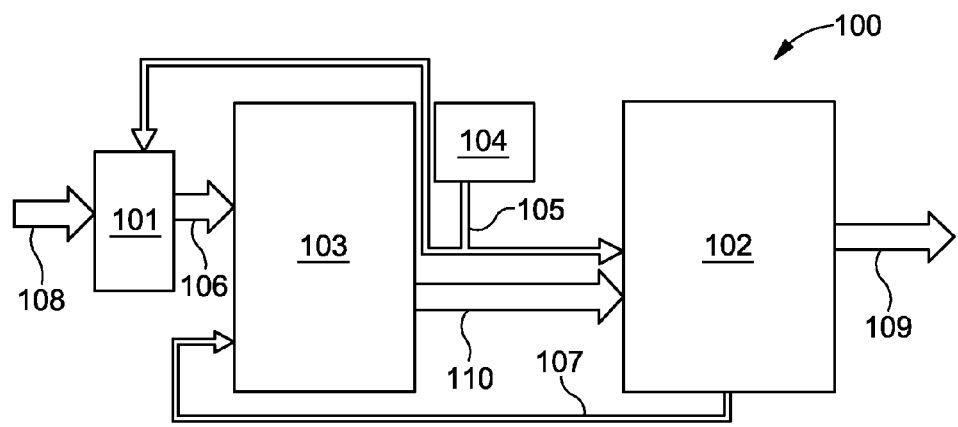
FIG. 1 is a schematic diagram of a synchronised logic circuit with a continuously running clock module.

FIG. 1 is a schematic block diagram of a synchronised logic circuit 100. The circuit 100 comprises input and output modules 101, 102, each of which are in the form of flip-flop circuits that transfer an input state 108, 110 to an output state 106, 109 on receiving a clock signal 105 from a clock module 104. The input and output modules 101, 102 thereby synchronise operation of the logic circuit 100 according to the clock signal 105 received from the clock module 104. A decision logic module 103 receives an input 106 from the input module 101 and provides an output 110 to the output module 102. The output state 110 of the decision logic module 103 is dependent on the input state 106 together with the state 107 of the output module 102. In operation, if the input 108 changes, this change is fed through to the output state 106 of the input module 101 at the next clock signal 105. The decision logic module 103 then provides an output state 110, which may or may not change the output 109 of the output module 102 depending on how the logic module is configured. This output state 110 is implemented by and fed through to the output 109 of the output module 102 at the next clock signal.

As summarised above, a disadvantage of this arrangement is that the clock module 104 needs to be continuously running in order to pick up and pass through any changes in the input state 108 to the output state 109. To minimise the time between the input state 108 changing and the circuit 100 responding to this change, the clock signal 105 should be provided at as high a frequency as possible, provided this can be accommodated by the inherent delays in the other parts of the circuit. A higher frequency of clock operation, however, results in higher power consumption. Additionally, regardless of the clock frequency, the time delay between the input 108 changing and the input module 101 responding to this input change is variable, requiring a next clock signal 105 to occur.

Figure 2:
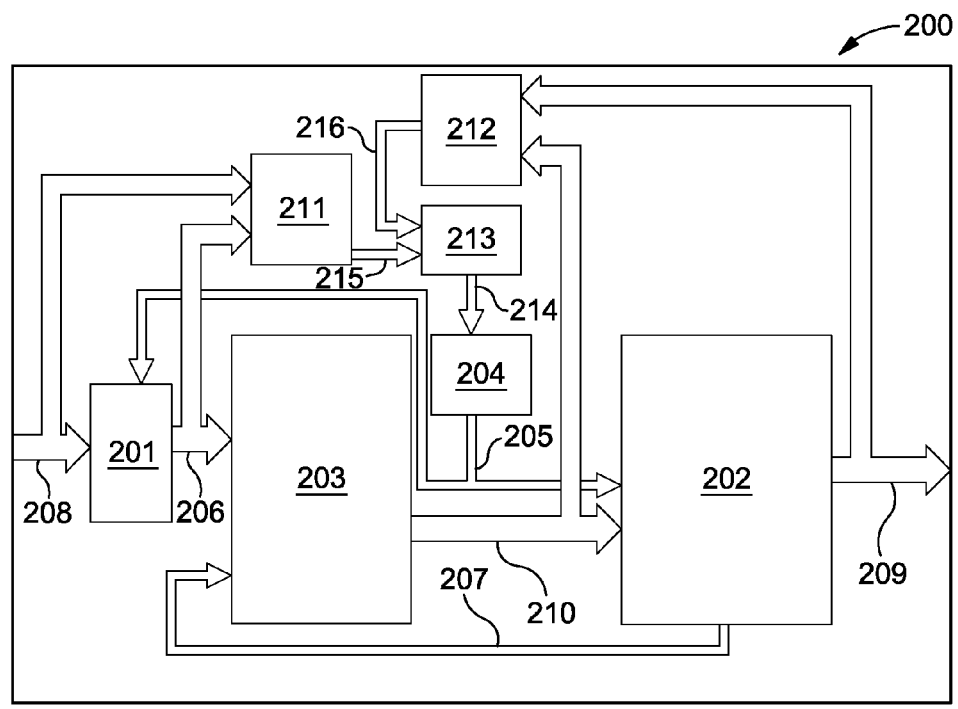
FIG. 2 is a schematic diagram of a synchronised logic circuit according to an embodiment of the invention.

FIG. 2 is a schematic block diagram of an exemplary synchronised logic circuit 200 according to an embodiment of the invention. As with the logic circuit 100 of FIG. 1, the logic circuit 200 comprises input and output modules 201, 202, a decision logic module 203 and a clock module 204.

As described above, the input and output modules 201, 202 synchronise operation of the logic circuit 200 according to the clock signal 205 received from the clock module 204. The decision logic module 203 receives an input 206 from the input module 201 and provides an output 210 to the output module 202. This output 210 provides the next output state of the output module 202. The output state 210 of the decision logic module 203 is dependent on the current input state provided to the decision logic module, namely the input state 206 from the input module together with the state 207 of the output module 202. In operation, if the input 208 changes, this change is fed through to the output state 206 of the input module 201 at the next clock signal 205. The decision logic module then provides an output state 210, which may or may not change the output state 209 of the output module 202 depending on how the logic module is configured. The output state 210 is implemented by and fed through to the output 209 of the output module 202 at the next clock signal.

It can be appreciated that operation of the input and output modules 201, 202 and of the decision logic module 203 is similar to that of the corresponding modules 101, 102, 103 of the logic circuit 100 in FIG. 1. The clock module 204, however, operates differently.

Instead of operating continuously, the clock module 204 provides a clock signal 205 to the input and output modules 201, 202 when provided with an enable signal 214. This enable signal 214 is provided dependent on changes in the input or output states 208, 209 of the logic circuit.

An input detection module 211 detects a change in the input 208 by comparing the input module input 208 to the decision logic circuit input 206. If these states are different, the input detection module 211 provides an enable signal 215.

An output detection module 212 detects a change in the output 209 by comparing the output module output 209 to the decision logic circuit output 210. If these states are different, the output detection module 212 provides an enable signal 216.

The enable signals 215, 216 are provided to an OR gate 213. The OR gate provides an enable signal 214 to the clock if an enable signal is provided by either or both of the input and output detection modules 211, 212.

In alternative embodiments the output detection module 212 and OR gate 213 might not be required, as the logic circuit 200 could be operated such that the clock 204 is configured to provide a defined series of clock signals once an enable signal 214 is received from the input detection circuit 211 alone. Having both input and output detection modules 211, 212 allows the clock module 204 to provide a clock signal 205 only when required, i.e. only when the input and output modules 201, 202 need to transfer a changed input state, thereby minimising on power requirements for the clock module 204.

In operation, the clock module 204 will continue to run until all changes have been processed and the outputs of both of the input and output detection modules 211, 212 are inactive.

Figure 3:
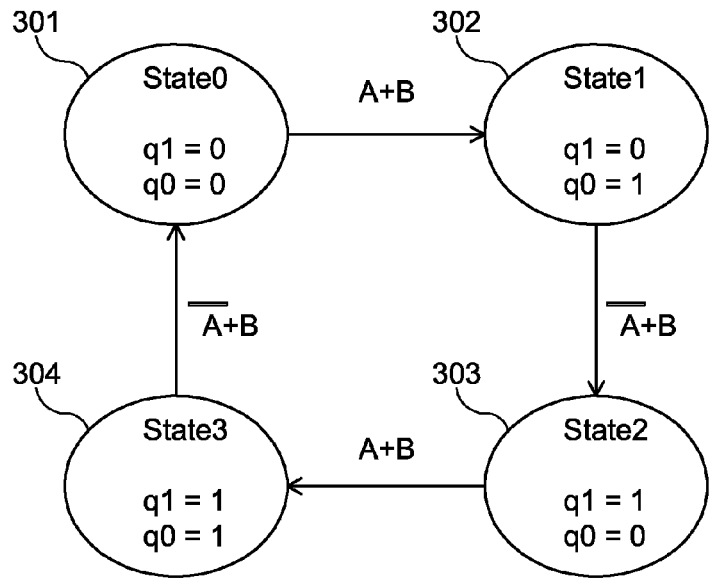
FIG. 3 is a schematic diagram of a series of operations of an exemplary state machine.

In the embodiment illustrated in FIG. 2, the decision logic module 203 consists of combinatorial logic that generates an output vector 210 representing the next state that the output module 202 should go to, which is based on an input vector 206 and actual state 207 of the output module 202. The logic circuit 200 may in general be considered to operate as a state machine, i.e. configured to perform a defined series of finite logic operations dependent on changes to the input state. FIG. 3 illustrates an exemplary state diagram of a simple type of state machine, which cycles through a series of four distinct states 301-304 dependent on the values of inputs A and B. The four distinct states are 00, 01, 10 and 11. Depending on the inputs A, B the sequence 00→01→10→11→00 is followed with the clock frequency if B=1 or stepwise when B=0 and A changes its value. A transition from State 0 301 to State 1 302 is made when A+B is true. A transition from State 1 302 to State 2 303 is made when $\overline{A}$+B is true. A transition from State 2 303 to State 3 304 is made when A+B is true. A transition back to State 0 301 from State 3 304 is made when $\overline{A}$+B is true. The state machine can transition only in this defined sequence of steps, with each transition being dependent on receiving the required input combination. It is clear from this example that if B is always 1 then the states are stepped through in sequence at maximum speed, and if B=0 the states are changed only when A changes.

Figure 4:
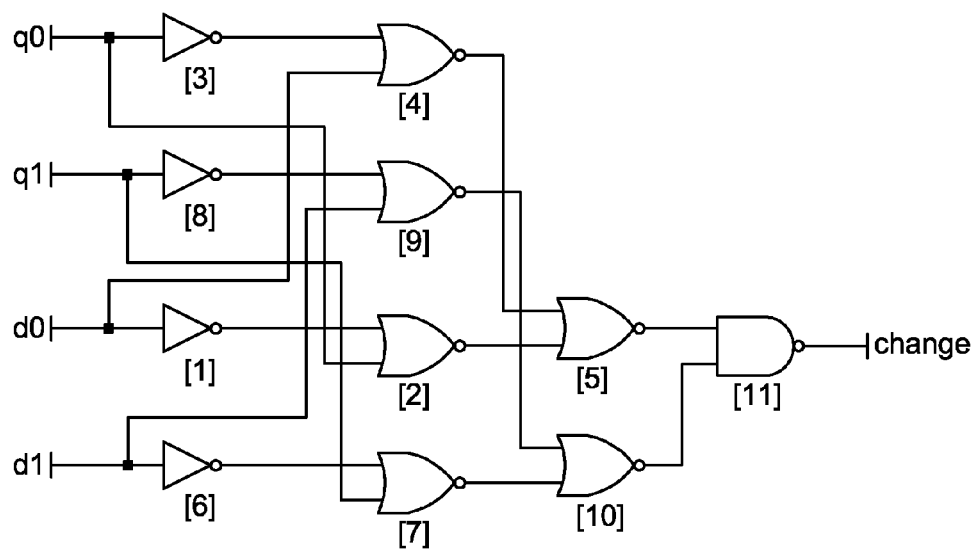
FIG. 4 is a diagram of a logic circuit implementing the state machine of FIG. 3.

Table 1 below is a truth table defining operation of such a state machine using two inputs, in which values q0 and q1 are the first inputs and d0 and d1 are the second inputs. When q0 and q1 are different from d0 and d1 then the change output value is 1. A logical representation of this truth table is illustrated in FIG. 4.

Following the state diagram in FIG. 3, the next state decision logic results in the truth table shown in Table 2, in which q0 and q1 represent the actual state, a and b represent the inputs and d0 and d1 represents the next state to be jumped to.

TABLE 1

Truth table representing change states of a state machine according to FIG. 3 with two inputs.

| Term | q0 | q1 | d0 | d1 | => | change |
|------|----|----|----|----|----|--------|
| 0 | 0 | 0 | 0 | 0 | | 0 |
| 1 | 0 | 0 | 0 | 1 | | 1 |
| 2 | 0 | 0 | 1 | 0 | | 1 |
| 3 | 0 | 0 | 1 | 1 | | 1 |
| 4 | 0 | 1 | 0 | 0 | | 1 |
| 5 | 0 | 1 | 0 | 1 | | 0 |
| 6 | 0 | 1 | 1 | 0 | | 1 |
| 7 | 0 | 1 | 1 | 1 | | 1 |
| 8 | 1 | 0 | 0 | 0 | | 1 |
| 9 | 1 | 0 | 0 | 1 | | 1 |
| 10 | 1 | 0 | 1 | 0 | | 0 |
| 11 | 1 | 0 | 1 | 1 | | 1 |
| 12 | 1 | 1 | 0 | 0 | | 1 |
| 13 | 1 | 1 | 0 | 1 | | 1 |
| 14 | 1 | 1 | 1 | 0 | | 1 |
| 15 | 1 | 1 | 1 | 1 | | 0 |

TABLE 2

Truth table representing the next state decision logic of the state machine of FIG. 3.

| Term | q1 | q0 | a | b | => | d1 | d0 |
|------|----|----|---|---|----|----|----|
| 0 | 0 | 0 | 0 | 0 | | 0 | 0 |
| 1 | 0 | 0 | 0 | 1 | | 0 | 1 |
| 2 | 0 | 0 | 1 | 0 | | 0 | 1 |
| 3 | 0 | 0 | 1 | 1 | | 0 | 1 |
| 4 | 0 | 1 | 0 | 0 | | 1 | 0 |
| 5 | 0 | 1 | 0 | 1 | | 1 | 0 |
| 6 | 0 | 1 | 1 | 0 | | 0 | 1 |
| 7 | 0 | 1 | 1 | 1 | | 1 | 0 |
| 8 | 1 | 0 | 0 | 0 | | 1 | 0 |
| 9 | 1 | 0 | 0 | 1 | | 1 | 1 |
| 10 | 1 | 0 | 1 | 0 | | 1 | 1 |
| 11 | 1 | 0 | 1 | 1 | | 1 | 1 |
| 12 | 1 | 1 | 0 | 0 | | 0 | 0 |
| 13 | 1 | 1 | 0 | 1 | | 0 | 0 |
| 14 | 1 | 1 | 1 | 0 | | 1 | 1 |
| 15 | 1 | 1 | 1 | 1 | | 0 | 0 |

A simulation result of an embodiment with the functionality described above is illustrated in FIG. 5. This illustrates a series of voltage signals 501-506, being a clock signal 501 V(ck), an output change signal 502 V(changeoutputs), an input change signal 503 V(change_inputs), signals b and a 504, 505 V(b), V(a) and an output state signal 506 V(state).

Figure 6:
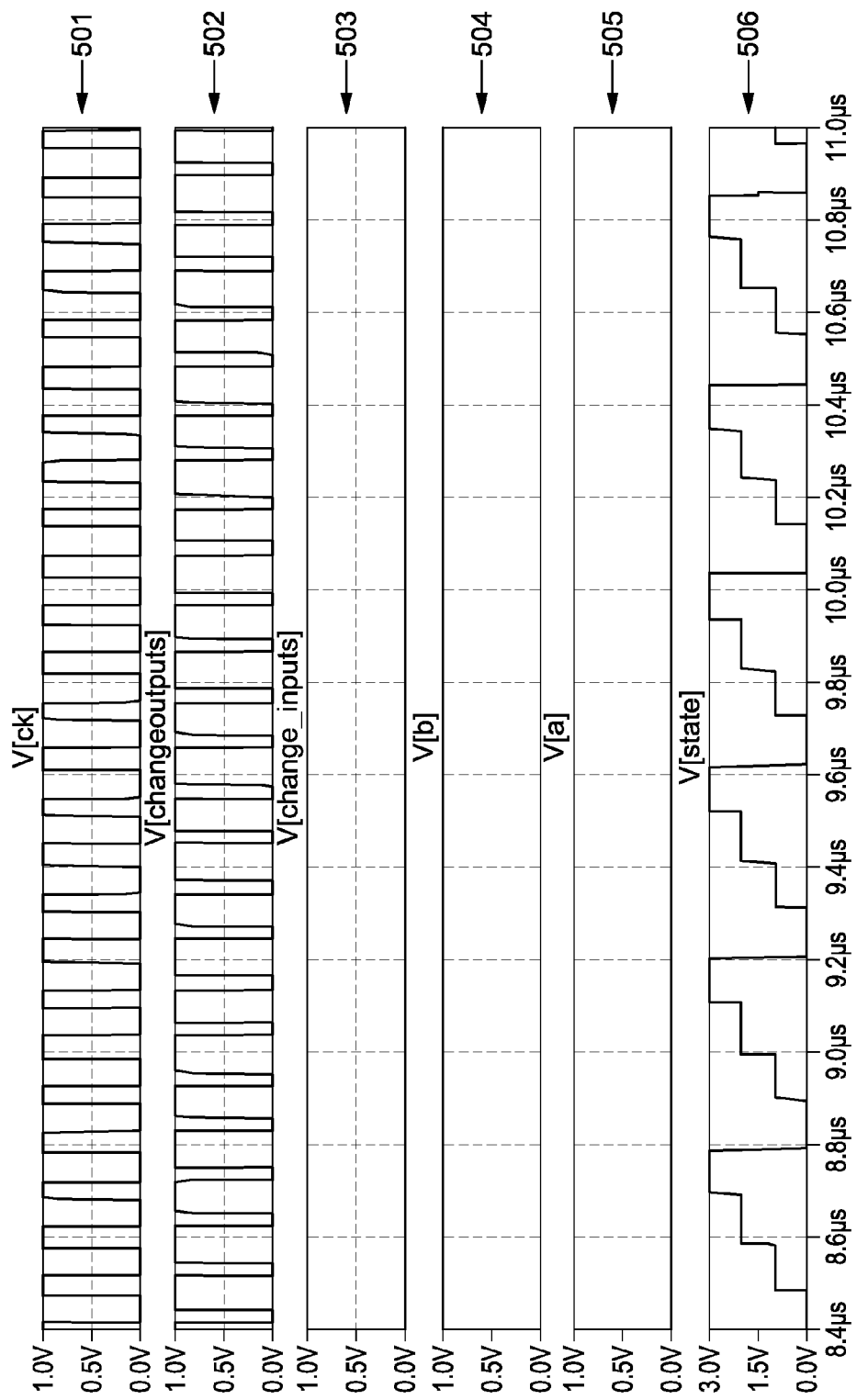
FIG. 6 is a magnified view of a portion of the voltage traces of FIG. 5.

First and second regions 511, 512 illustrates the situation where V(b) is high (region 511) and where V(b) is low (region 512), respectively. When V(b) is high, the clock signal V(ck) operates continuously, and the output state V(state) changes according to the V(changeoutputs) signal. A magnified view of the various signals within region 511 is illustrated in FIG. 6.

Whenever V(b) turns high (regions 511) or low (region 512), the input change signal 502 turns high momentarily as V(b) changes, thereby generating a clock pulse that can be used to handle the event. While V(b) remains high, the clock runs continuously as a result of the V(changeoutputs) signal 502 since, according to the state diagram, the system should jump to the next state on every clock pulse.

While V(b) is low, however (region 512), the system remains in the last state achieved, therefore not requiring any change. This results in the clock being completely stopped and the digital part effectively drawing no power, thereby dramatically reducing power consumption.

Figure 5:
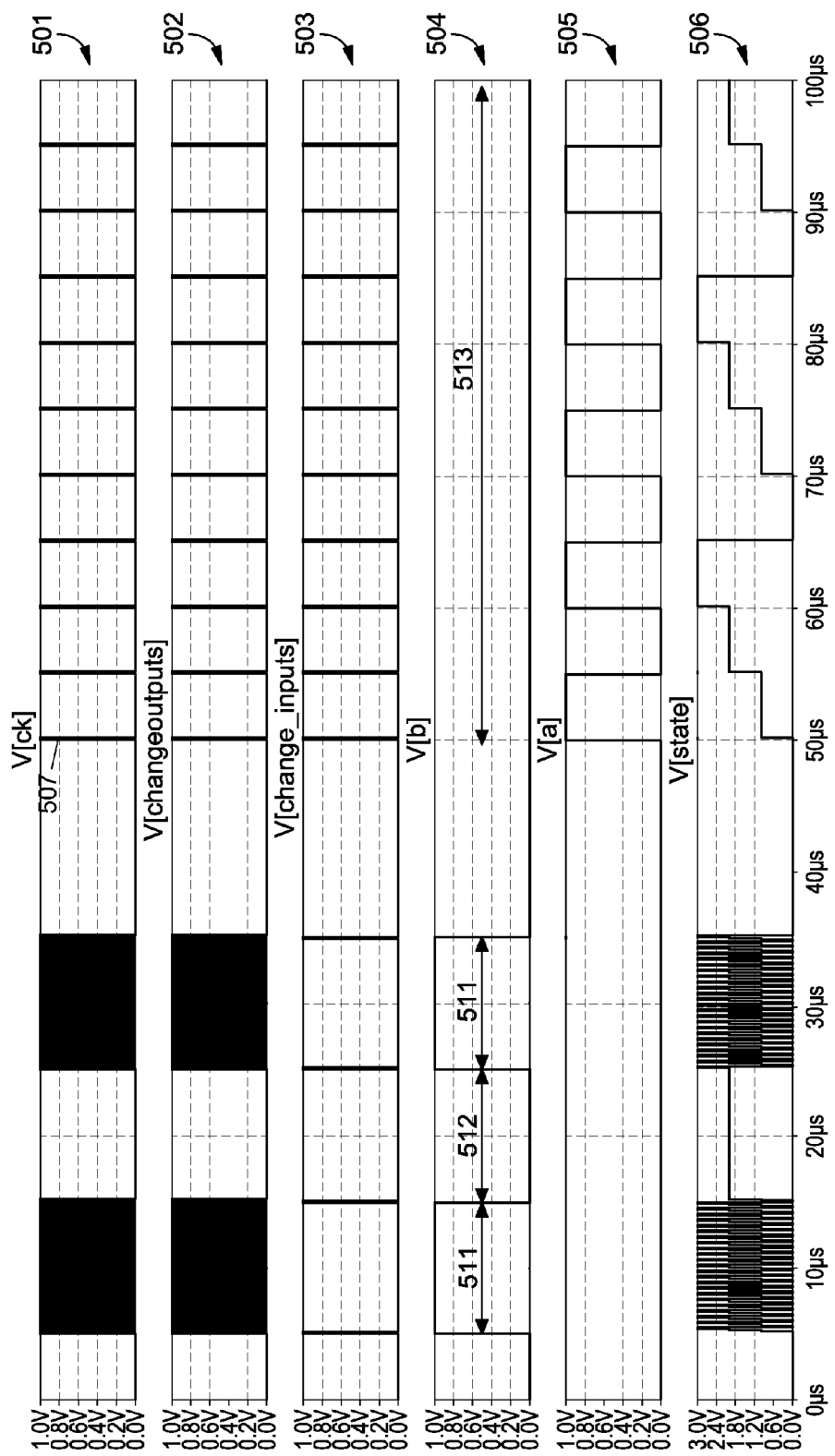
FIG. 5 is a series of simulated voltage traces during operation of an exemplary synchronised logic circuit.

The remaining part of FIG. 5, indicated by region 513, illustrates the situation when B=0 and A is either high or low. According to the state diagram, a change is only required when A changes, i.e. only at the positive or negative edge of a change at the inputs occurring, which generates a first clock pulse. As a result of this first clock pulse the inputs are clocked into the synchronization flip flops, changing the outputs of the input module 201 (FIG. 2). As the next state, the decision logic module 203 changes its outputs, thereby triggering a next event via detection of a change in the outputs. This generates a second clock pulse shortly afterwards.

Figure 7:
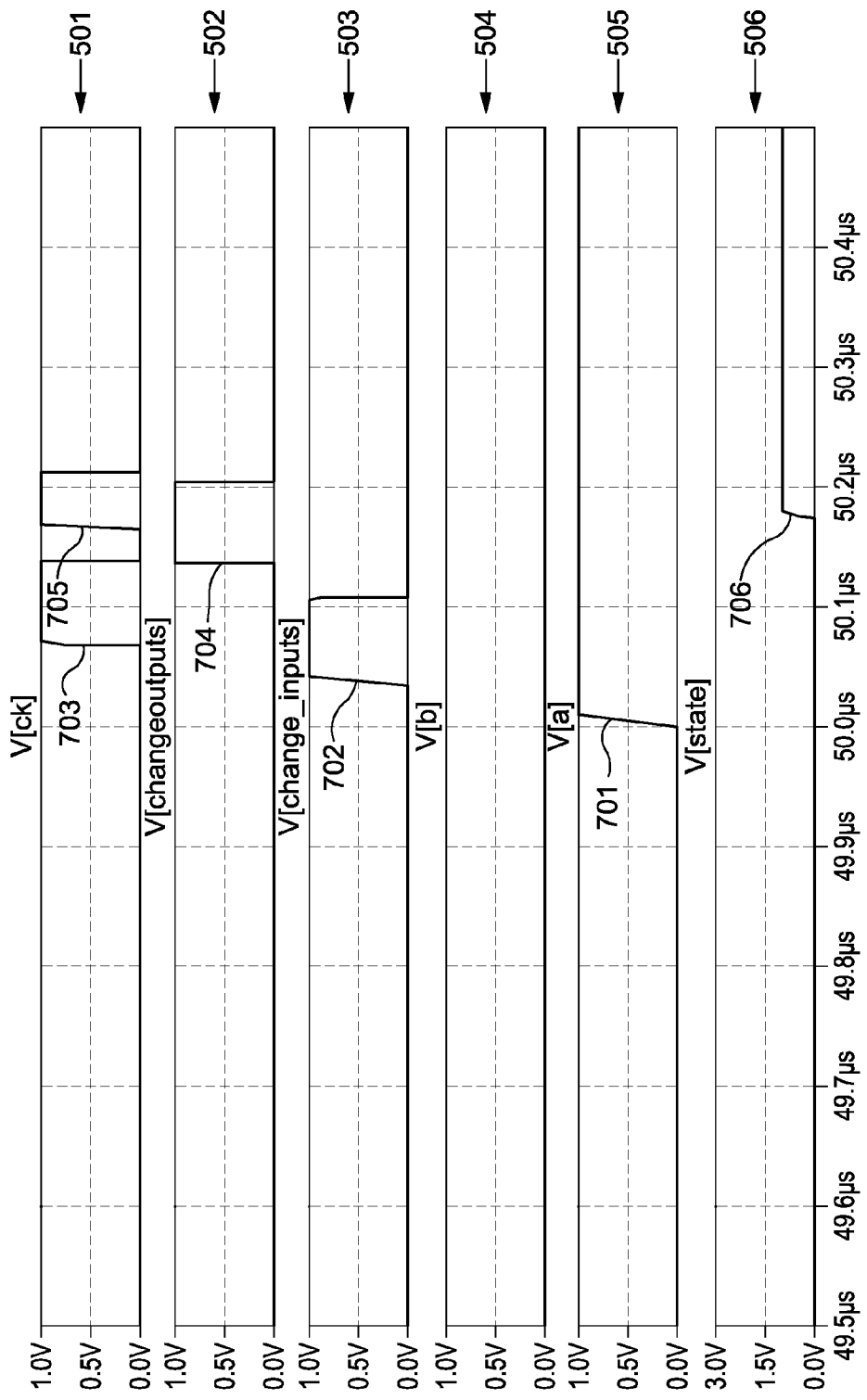
FIG. 7 is a series of simulated voltage traces illustrating a single sequence of transitions.

The two clock pulses 507 used to trigger each event are indistinguishable in FIG. 5, but can be seen in more detail in FIG. 7. The transition 701 of input A from 0 to 1 at t=50.0 μs triggers an event by first causing V(change_inputs) to change 702. This change in turn generates an enable signal for the clock module, causing a first clock pulse 703, which synchronizes the inputs. As result of this, a second event is generated by a transition 704 in the output change signal V(changeoutputs). This in turn generates a second clock pulse 705. This second clock pulse 705 then causes a transition 706 in the output state signal V(state), changing from state 0 to state 1.

As the changing input A triggers the above described sequence, which is all based on fixed delays, the result is that the total delay is also fixed. In the particular illustrated example, this total delay, i.e. the total time between the first and last transitions 701, 706 is 165 ns.

Figure 8:
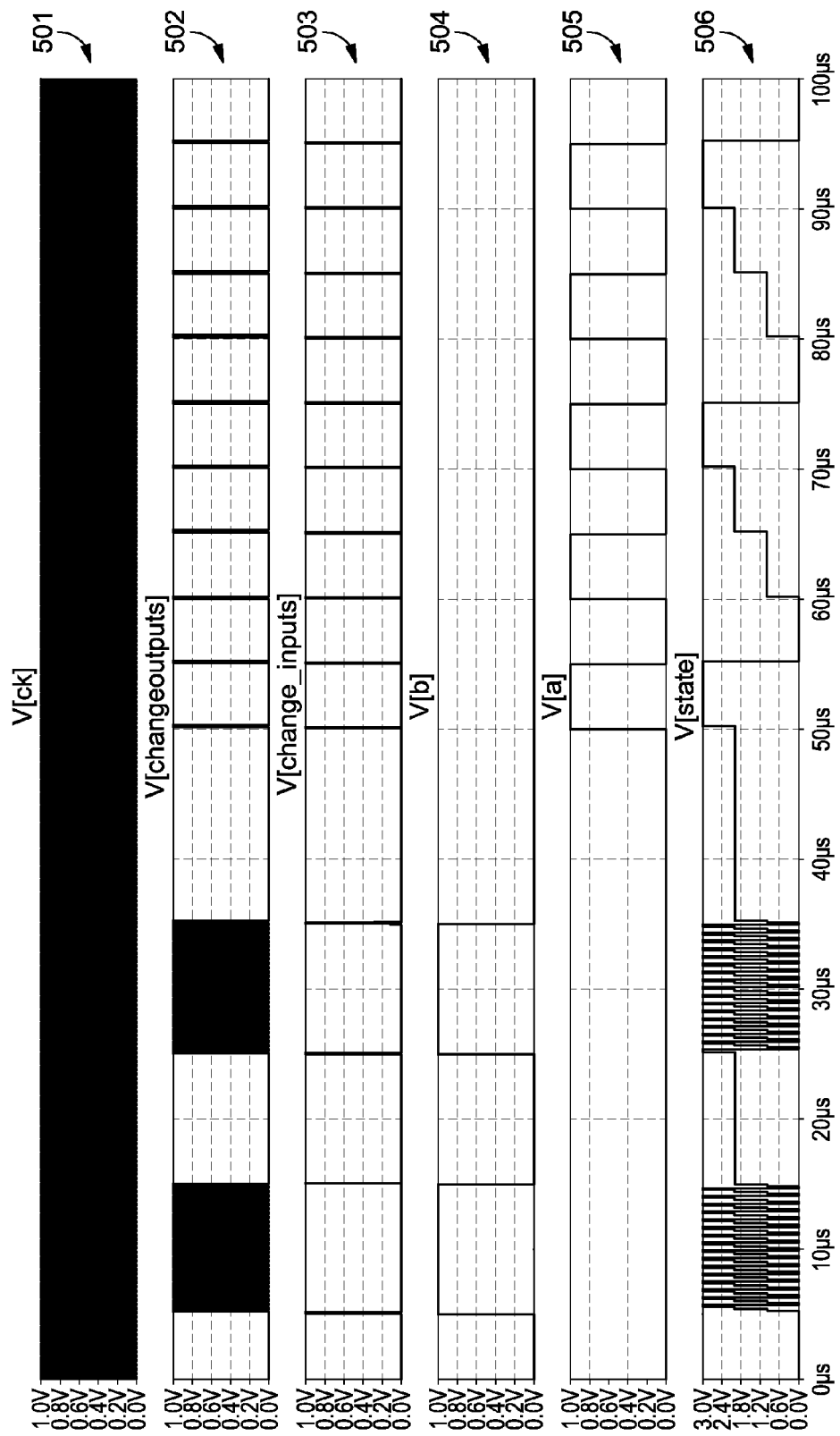
FIG. 8 is a series of simulated voltage traces during operation of a synchronised logic circuit with a continuously operating clock signal.
Figure 9:
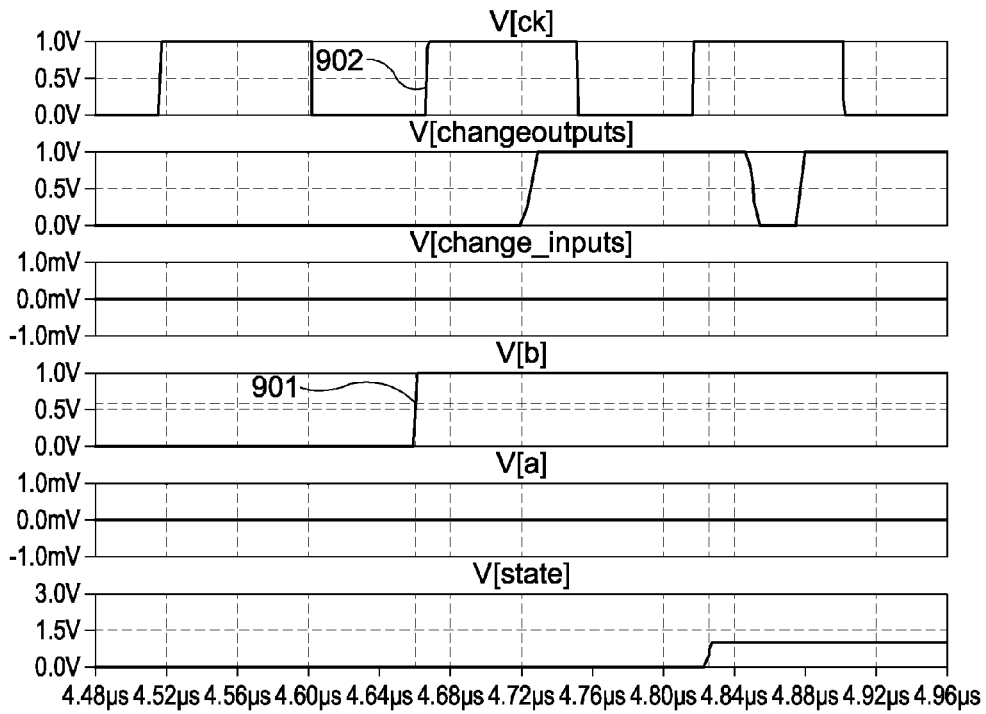
FIG. 9 is a series of simulated voltage traces illustrating a single sequence of transitions for a synchronised logic circuit with a continuously operating clock, in which a first transition occurs just before the start of a clock pulse.
Figure 10:
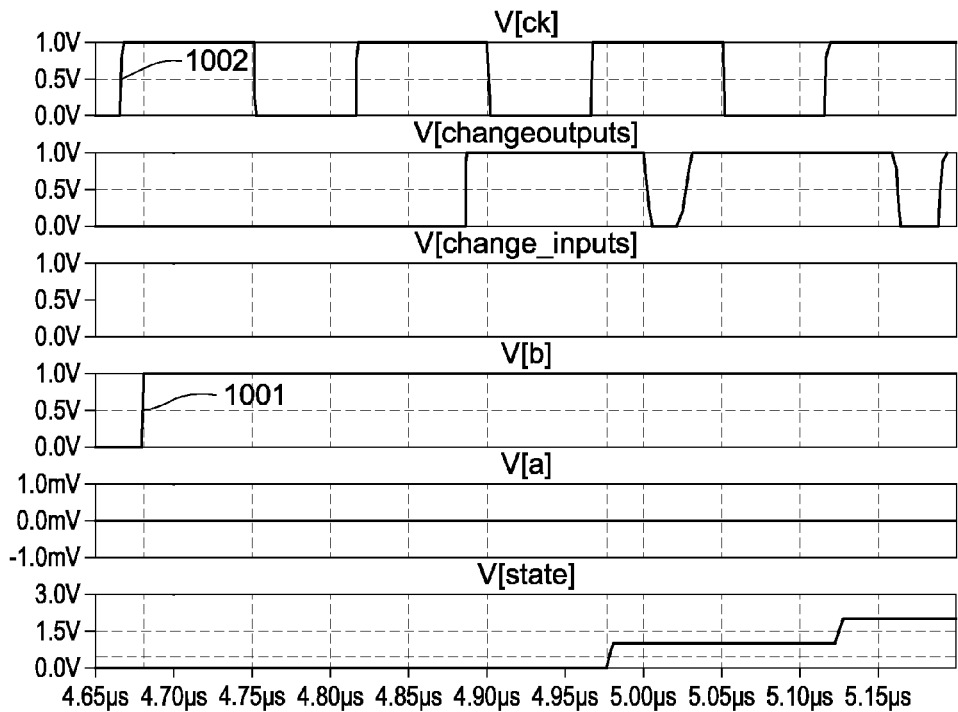
FIG. 10 is a series of simulated voltage traces illustrating a single sequence of transitions for a synchronised logic circuit with a continuously operating clock, in which a first transition occurs just after the start of a clock pulse.

A comparison can be made with the situation where a clock module is operated continuously, as illustrated in FIG. 8. In this fixed clock frequency system, a continuous level of power is drawn by the circuit due to the clock signal 501, even when no changes are required. A magnified view of a pair of comparable sequences of transitions to those in FIG. 7 is illustrated in FIGS. 9 and 10. FIG. 9 illustrates an example where a transition 901 in the B signal occurs just before a clock pulse 902, whereas FIG. 10 illustrates an example where a transition 1001 in the B signal occurs just after a clock pulse 1002. The two examples therefore provide best and worst case scenarios for the total time delay between the first and last transitions. In the first example in FIG. 9, because the B input changes just before a clock pulse, this results in the shortest delay. In this particular example, the delay of around 165 ns between the B signal changing and the output state changing is equal to the delay in the example of FIG. 7. FIG. 10, however, shows the worst case situation, where the B input change 1001 is just after the clock pulse 1002, resulting in the longest delay. This results in a delay to the output of 295 ns, which is almost a complete clock period. This comparison illustrates the difference between the use of a fixed clock period, resulting in a variable delay, compared with a clock sequence such as in the embodiment in FIG. 2 that results in a fixed short delay. Accordingly, because the delay between a change in the input or output requirement and the corresponding clock signal implementing the change is known, this delay can be accounted for in, for example, controller design.

Figure 11:
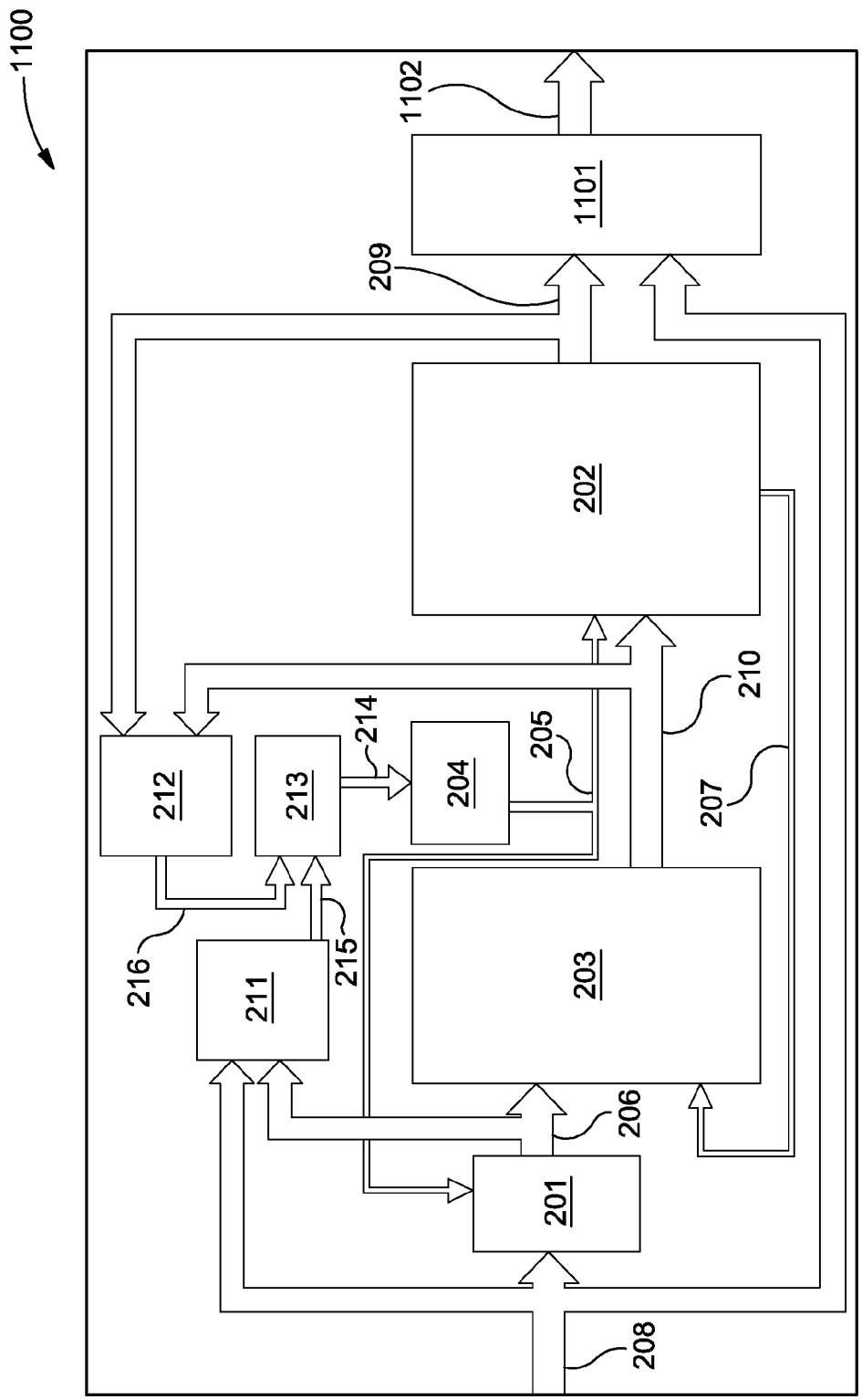
FIG. 11 is a schematic diagram of a synchronised logic circuit according to an alternative embodiment of the invention.

According to alternative embodiments, the decision logic module 203 (FIG. 2) may implement a state machine according to a Moore or Mealy type. The exemplary embodiment in FIG. 2 illustrates the arrangement in the case of a Moore type state machine. In the alternative embodiment of a Mealy type state machine, a further logic module 1101 may be added to the output 209 of the synchronised logic circuit 1100, as illustrated in FIG. 11. The further logic module 1101 is provided with the output signal 209 of the output module 202 and the input signal 208 of the input module 201, and provides an output signal 1102 in dependence on these signals. The other components in the synchronised logic circuit 1100 may be the same as in the embodiment in FIG. 2 and described above.

According to further embodiments, a large decision logic module may be divided up into two or more smaller parts, with each part being controlled by a separate clock module. By splitting up the logic into smaller parts it is only required to have the clock running for those parts that need to be processed as result of a changing input. This means that the input and output detection modules will only trigger clock pulses for the respective parts of the logic, so the total number of logic switching can be made smaller, resulting in a reduced power consumption compared to the situation where only one set of input and output detection modules is used for the whole logic.

Figure 12:
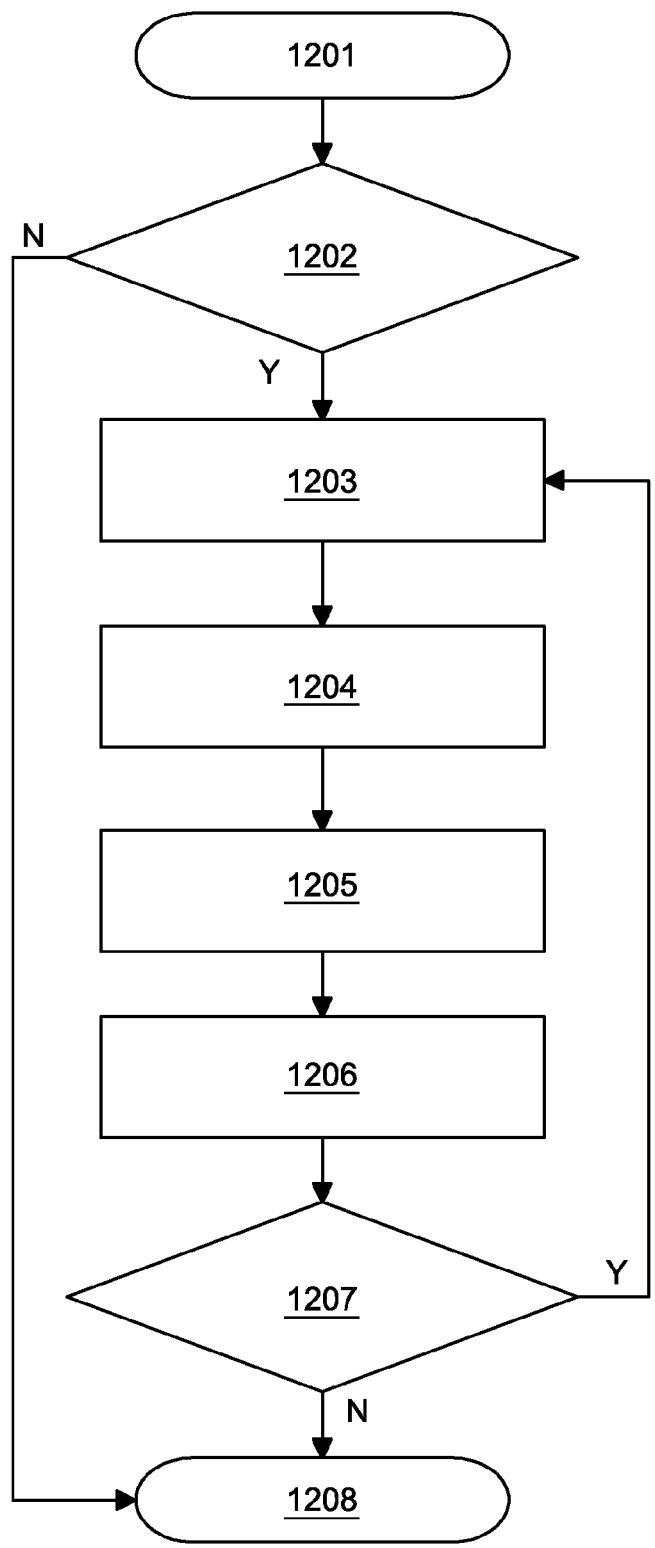
FIG. 12 is a flowchart illustrating a method according to an exemplary embodiment.

FIG. 12 illustrates a schematic flow diagram describing a single sequence for an exemplary method of operating the synchronised logic circuit 200, 1100. Once the circuit starts operation (step 1201), the input detection module 211 checks for a change in the input 208 (step 1202). If a change is detected, an enable signal 215 is provided to the clock module 204 (step 1203). Otherwise, the process ends (step 1208). After the enable signal 215 is provided, the clock module 204 provides a clock pulse 205 to the input and output modules 201, 202 (step 1204), which in response transfer their input states 208, 210 to their output states 206, 209 (step 1205). The decision logic module 203 then provides the next output state 210 to the output module 202 (step 1206). In embodiments where an output detection module 212 is present, a check is then made to determine whether the output 209 has changed (step 1207). If a change is detected, the preceding processes from providing an enable signal (step 1203) to providing a next output state (step 1206) are repeated. Otherwise, the process ends (step 1208). In practice, the sequence is in effect continually repeated, with the process halting at the step of detecting a change in input (step 1202) until a change is detected.

Embodiments of the invention can be usefully applied to synchronous digital systems that do not require changes at every clock cycle of a continuously running clock and where power reduction is important. A particular application is for controllers for switch mode power supplies where energy consumption requirements under fractional and no load situations are important. In such situations, the converter may be switching at low frequencies. This results in the number of events being very low, but sometimes there is a need for a fast reaction to an event with minimum delay required, for example when the converter operates at no load and a large positive step up on load occurs. Another example is a digital communication protocol where no communication occurs for most of the time during no load operation, but where fast communication requiring short delays is needed at some intervals. Such situations are therefore particularly suited for implementing embodiments according to the invention. Other applications where synchronised decision logic is needed may also be relevant.

Other embodiments are intentionally within the scope of the invention as defined by the appended claims.

The invention claimed is:

1. A synchronised logic circuit comprising:
   an input module;
   an output module;

a decision logic module connected between the input and output modules and configured to provide a next output state to the output module dependent on a current input state provided from the input and output modules;

a clock module connected to the input and output modules and configured to provide a clock signal for synchronising operation of the input and output modules; and an input detection module connected to the input module and configured to provide an enable signal to the clock module on detection of a change in an input provided to the input module, wherein the clock module is configured to provide a clock signal to the input and output modules on receiving the enable signal from the input detection circuit.

2. The synchronised logic circuit of claim 1 wherein the input detection module is configured to compare an output state of the input module with an input state of the input module and provide the enable signal to the clock module when the input and output states of the input module are unequal.

3. The synchronised logic circuit of claim 1, comprising an output detection module connected to the output module and configured to provide an enable signal to the clock module on detection of a change in an output provided by the output module, wherein the clock module is configured to provide a clock signal to the input and output modules on receiving the enable signal from the output detection circuit.

4. The synchronised logic circuit of claim 3 wherein the output detection module is configured to compare an output state of the output module with an input state of the output module and provide the enable signal to the clock module when the input and output states of the output module are unequal.

5. The synchronised logic circuit of claim 3, wherein the clock module is configured to provide a clock signal only upon receiving an enable signal from either or both of the input and output detection modules.

6. The synchronised logic circuit of claim 1, wherein the logic circuit is configured to operate as a Moore type state machine.

7. The synchronised logic circuit of claim 1, wherein the logic circuit is configured to operate as a Mealy type state machine, the synchronised logic circuit comprising a further logic module connected to the output module and configured to provide an output state dependent on the output state of the output module and the input state of the input module.

8. The synchronised logic circuit of claim 1, wherein the input and output modules comprise a flip-flop configured to transfer an input state to an output state upon receiving a clock signal.

9. A logic circuit structure comprising first and second synchronised logic circuits according to claim 1, wherein the output module of the first synchronised logic circuit is connected to the input module of the second synchronised logic circuit.

10. A switched mode power supply comprising a synchronised logic circuit or logic circuit structure according to claim 1, wherein the synchronised logic circuit or logic structure is configured to operate a switching state of the power supply.

11. A digital communications device comprising a synchronised logic circuit or logic circuit structure according to claim 1, wherein the synchronised logic circuit or logic structure is configured to operate a digital communications protocol.

12. A method of operating a synchronised logic circuit according to claim 1, comprising the sequential steps of:
    the input detection module detecting a change in the input provided to the input module;
    the input detection module providing an enable signal to the clock module;
    the clock module providing a clock pulse signal to the input and output modules;
    the input and output modules each transferring an input state to an output state in response to the clock pulse; and
    the decision logic responding to the output state of the input and output modules by providing a next output state to the output module.

13. The method of claim 12 comprising the further sequential steps of:
    the output detection module detecting a change in the output provided by the output module;
    the output detection module providing an enable signal to the clock module;
    the clock module providing a clock pulse to the input and output modules;
    the input and output modules each transferring an input state to an output state in response to the clock pulse; and
    the decision logic responding to the output state of the input and output modules by providing a next output state to the output module.

* * * * *